United States Patent
Shahi et al.

(10) Patent No.: US 10,254,318 B2
(45) Date of Patent: Apr. 9, 2019

(54) SYSTEMS AND METHODS FOR ESTIMATING INPUT POWER OF AN ELECTRIC MOTOR

(71) Applicant: Nidec Motor Corporation, St. Louis, MO (US)

(72) Inventors: Prakash B. Shahi, St. Louis, MO (US); Robert J. Ploof, Jr., Collinsville, IL (US)

(73) Assignee: Nidec Motor Corporation, St. Louis, MO (US)

( * ) Notice: Subject to any disclaimer, the term of this patent is extended or adjusted under 35 U.S.C. 154(b) by 1041 days.

(21) Appl. No.: 13/904,884

(22) Filed: May 29, 2013

(65) Prior Publication Data

US 2014/0358458 A1  Dec. 4, 2014

(51) Int. Cl.
*G01R 21/00* (2006.01)
*G01R 21/06* (2006.01)
*B60L 11/18* (2006.01)

(52) U.S. Cl.
CPC ........ *G01R 21/006* (2013.01); *B60L 11/1803* (2013.01); *B60L 2220/12* (2013.01); *B60L 2220/18* (2013.01); *B60L 2220/20* (2013.01); *B60L 2220/30* (2013.01); *B60L 2240/421* (2013.01); *B60L 2240/423* (2013.01); *B60L 2260/44* (2013.01); *Y02T 10/642* (2013.01); *Y02T 10/7005* (2013.01)

(58) Field of Classification Search
CPC .............. G01R 21/006; B60L 11/1803; B60L 2220/20; B60L 2220/18; B60L 2220/30; B60L 2260/44; B60L 2240/423; B60L 2220/12; B60L 2240/421; Y02T 10/7005; Y02T 10/642; G06F 17/15; H02P 21/14; H02P 21/141; H02P 21/143; H02P 21/16; H02P 21/18; H02P 21/20; H02P 21/22; H02P 21/30; H02P 25/14; H02P 25/145; H02P 23/22
USPC .......................................................... 702/61
See application file for complete search history.

(56) References Cited

U.S. PATENT DOCUMENTS

| | | | | |
|---|---|---|---|---|
| 6,025,692 A | * | 2/2000 | Yamada | H02P 6/08 318/700 |
| 6,163,127 A | * | 12/2000 | Patel | B60L 11/1803 318/700 |
| 7,208,895 B2 | | 4/2007 | Marcinkiewicz et al. | |
| 2006/0125439 A1 | * | 6/2006 | Ajima | B60K 6/26 318/716 |
| 2007/0062755 A1 | * | 3/2007 | Krieger | B62D 5/0472 180/446 |
| 2008/0039990 A1 | * | 2/2008 | Stevens | B62K 3/007 701/22 |
| 2011/0012544 A1 | * | 1/2011 | Schulz | B60L 15/025 318/400.02 |

(Continued)

OTHER PUBLICATIONS

Astrom, Control System Design, p. 144-176 (2002).*

(Continued)

*Primary Examiner* — Michael P Nghiem
(74) *Attorney, Agent, or Firm* — Hovey Williams LLP

(57) ABSTRACT

A method of estimating an input power of a motor comprises determining an output power of the motor; determining a speed of the motor; calculating a scaling factor as a function of the speed of the motor; and estimating the input power as a function of the scaling factor and the output power.

9 Claims, 2 Drawing Sheets

(56) References Cited

U.S. PATENT DOCUMENTS

| | | | | |
|---|---|---|---|---|
| 2011/0050142 A1* | 3/2011 | Lu | ............................ | H02P 23/14 |
| | | | | 318/461 |
| 2012/0139460 A1* | 6/2012 | Senkou | ............... | H02P 21/0096 |
| | | | | 318/400.02 |
| 2013/0172507 A1* | 7/2013 | Ebisawa | ................ | G01N 11/14 |
| | | | | 526/329.7 |
| 2013/0221885 A1* | 8/2013 | Hunter | ................ | H02P 21/0003 |
| | | | | 318/400.15 |
| 2013/0278200 A1* | 10/2013 | Fujii | ....................... | H02P 6/002 |
| | | | | 318/722 |
| 2013/0307457 A1* | 11/2013 | Hargis | .................... | H02P 29/68 |
| | | | | 318/472 |
| 2014/0306638 A1* | 10/2014 | Wu | ......................... | H02P 27/08 |
| | | | | 318/504 |
| 2014/0330469 A1* | 11/2014 | Yoshida | ................ | B60W 10/06 |
| | | | | 701/22 |
| 2014/0333241 A1* | 11/2014 | Zhao | ....................... | H02P 21/24 |
| | | | | 318/400.02 |
| 2016/0359442 A1* | 12/2016 | Zhao | ................... | H02P 21/0021 |

OTHER PUBLICATIONS

Rowell, Derek, 2.004 Dynamics and Control II, Massachusetts Institute of Technology (Spring 2008).*

Astrom, "Simple Control Systems," Control System Design (2002).*

* cited by examiner

SYSTEMS AND METHODS FOR ESTIMATING INPUT POWER OF AN ELECTRIC MOTOR

FIELD

The present invention relates to systems and methods for estimating the input power of an electric motor.

BACKGROUND

Electric motors are commonly used in a variety of applications including HVAC systems, washing machines, and dishwashers and typically include a stationary component called a stator and a rotating component called a rotor. The rotor rotates within (or around) the stator when the motor is energized with a driving waveform to rotate a shaft which in turn drives a fan, pump, pulley, or other component.

It is often desirable to know the input power of an electric motor for planning and efficiency purposes. For example, commercial, industrial, or other large-scale operations often simultaneously operate many different electric motors and wish to know the input power of each to determine and allocate system power requirements and/or control the motors for conservation and efficiency purposes.

The input power of an electric motor can be accurately determined with circuitry or other hardware that senses the input current and voltage of the motor. However, such hardware increases the costs and complexity of the motors and is therefore not practical for many low-cost motor applications.

The above section provides background information related to the present invention which is not necessarily prior art.

SUMMARY

Embodiments of the present invention solve the above described problems by providing improved systems and methods for estimating the input power of an electric motor without the use of current and voltage sensing circuitry or other hardware.

A motor assembly constructed in accordance with embodiments of the present invention may be used in a washing machine, HVAC system, pump system or any other application. The motor assembly broadly comprises an electric motor and a motor controller for powering and controlling the motor. The motor may employ any motor technology and includes a stator and a rotor. In one embodiment, the motor may be a three phase AC induction motor.

The motor controller powers and controls the motor and is programmed or otherwise configured to perform at least some of the methods and other functions described herein. In one embodiment, the motor controller is programmed or configured for estimating an input power of the motor by determining an output power of the motor; determining a speed of the motor; calculating a scaling factor as a function of the speed of the motor; and estimating the input power as a function of the scaling factor and the output power.

In some embodiments, the output power is estimated as a function of the speed of the motor and a torque of the motor. In other embodiments, the output power is estimated as a function of an output voltage and an output current of an inverter in a controller of the motor.

The speed of the motor may be sensed with a Hall effect sensor or other shaft speed sensor. Alternatively, the speed may be estimated as a function of an electrical characteristic of the motor. For example, the speed may be estimated by monitoring a current shunt wired to the motor controller to determine a stator current frequency, which is proportional to a speed of the motor.

In a particular embodiment of the invention, the motor controller is programmed or otherwise configured to estimate the motor's input power using the equation: input power=$(-K_1X^2+K_2X+K_3)$ times output power, where $K_1$, $K_2$, and $K_3$ are constants and X is the speed of the motor. However, the present invention is not limited to this particular equation.

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

DRAWINGS

Embodiments of the present invention are described in detail below with reference to the attached drawing figures, wherein.

Figure 1:
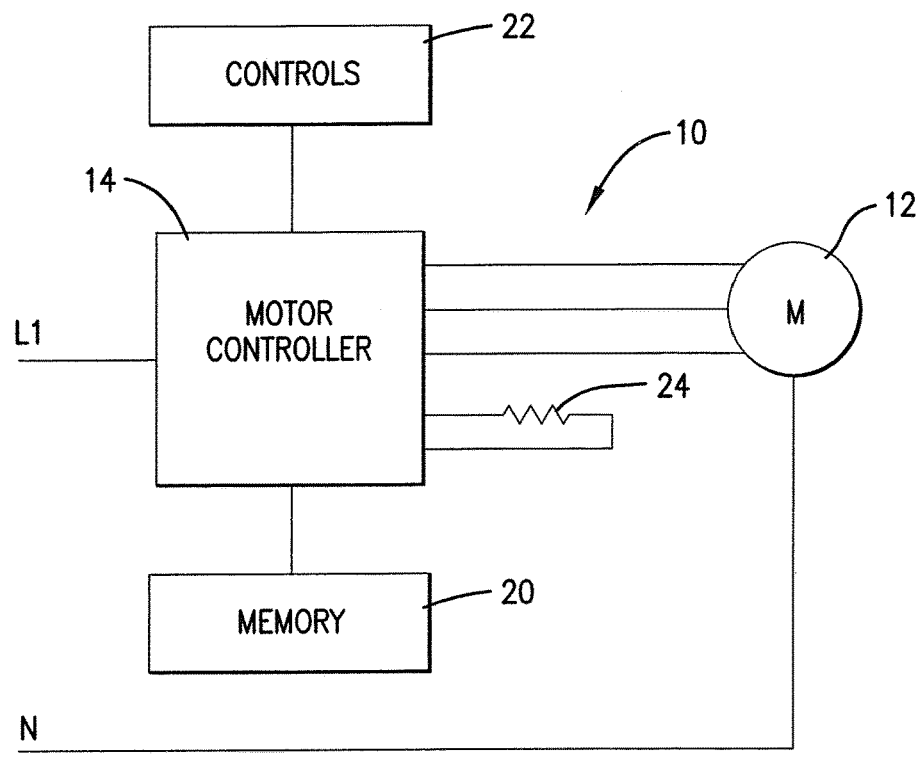
FIG. 1 is a block diagram of a motor assembly constructed in accordance with an embodiment of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings. The embodiments are intended to describe aspects of the invention in sufficient detail to enable those skilled in the art to practice the invention. Other embodiments can be utilized and changes can be made without departing from the scope of the claims. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning now to the drawing figures, and initially FIG. 1, a motor assembly 10 constructed in accordance with embodiments of the invention is illustrated. The motor assembly 10 may be used in any device or system, such as in a washing machine, HVAC system, pump system, or appliance. In one particular embodiment, the motor assembly 10 is designed for use in a blower assembly of an HVAC system, but the principles of the present invention are equally applicable to all uses of the motor assembly.

An embodiment of the motor assembly 10 broadly includes an electric motor 12 and a motor controller 14. Both the motor 12 and the motor controller 14 may be housed in a single protective motor shell or other enclosure. The motor assembly 10 may also include or be coupled with other components not relevant to the present invention.

Figure 2:
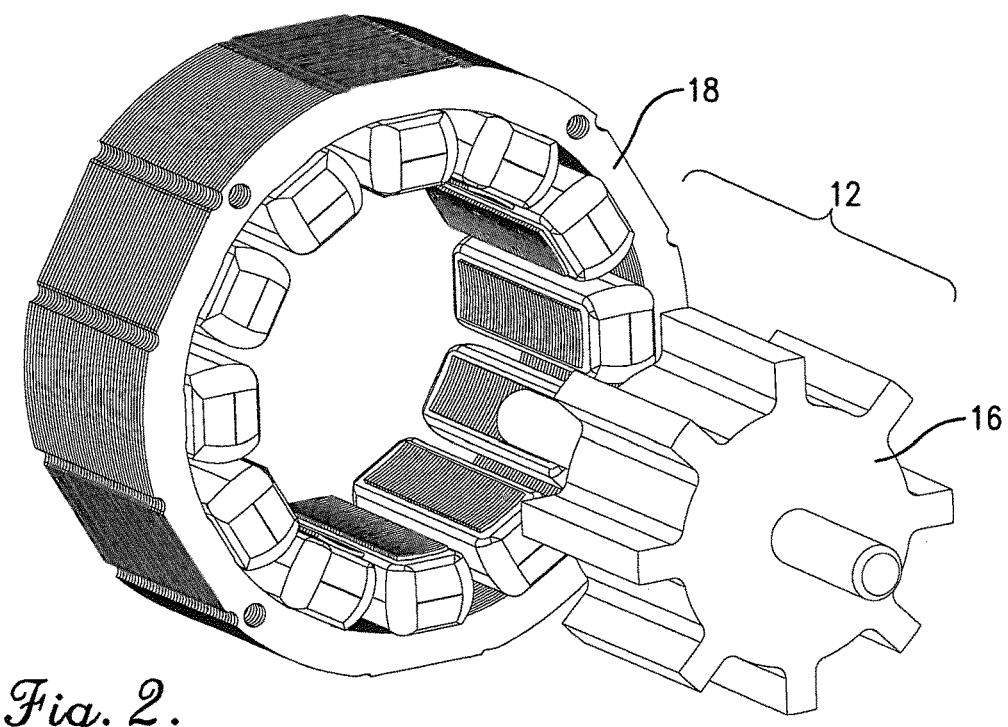
FIG. 2 is a schematic representation of the stator and rotor of the motor in the motor assembly of FIG. 1.

As best illustrated in FIG. 2, the electric motor 12 includes a rotor 16 and a stator 18. The motor 12 may operate on direct current (DC) or alternating current (AC), may be synchronous or asynchronous, and may be single phase or three phase. The motor 12 may be of any type, including but not limited to, a brushed DC motor, a switched reluctance motor, a coreless or ironless DC motor, a series wound universal motor, an induction motor, a torque motor, or a stepper motor. Moreover, the motor may be fixed speed, multi-speed, or variable speed and may have any horsepower (HP) rating.

The motor controller 14 provides power to and controls operation of the electric motor 12 and is programmed or otherwise configured to perform one or more of the functions or methods described below. The motor controller 14 may include any combination of circuitry, hardware, firmware, and/or software. In one particular embodiment, the motor controller 14 includes a custom application specific integrated circuit (ASIC) with a microprocessor that controls and drives a 3-phase inverter and various other electronic components. The motor controller includes internal or external memory 20 for storing computer programs as described below.

As shown in FIG. 1, the motor controller 14 may receive power from a single phase AC supply voltage at 115 VAC supplied by connections L1 and N, where L1 represents the "hot" side of the AC supply and N represents neutral, which is typically at earth potential. The AC supply voltage may also be 230 VAC, in which case the neutral line would be replaced with another hot supply line. The AC supply voltage may also be three phase 480 VAC.

The motor controller 14 may receive commands or operating instructions from one or more controls 22 such as thermostats, keypads, switches, or buttons as are commonly found on HVAC systems, washing machines, and other devices. The controls may be one or more separate components or may be integrated in the motor controller 14.

The motor controller 14 may also be coupled to a current shunt 24 for determining a stator current as described below. The current shunt 24 may be a discrete component coupled to the printed circuit board of the motor controller ASIC or may be incorporated in the stator of the motor or the inverter module of the motor controller.

Aspects of the invention may be implemented with one or more computer programs stored in or on the memory 20 or other non-transitory computer-readable medium residing on or accessible by the motor controller 14. Each computer program preferably comprises an ordered listing of executable instructions for implementing logical functions in the motor controller 14. Each computer program can be embodied in any non-transitory computer-readable medium for use by or in connection with an instruction execution system, apparatus, or device, such as a computer-based system, processor-containing system, or other system that can fetch the instructions from the instruction execution system, apparatus, or device, and execute the instructions. In the context of this application, a "computer-readable medium" can be any non-transitory means that can store the program for use by or in connection with the instruction execution system, apparatus, or device. The computer-readable medium can be, for example, but not limited to, an electronic, magnetic, optical, electro-magnetic, infrared, or semi-conductor system, apparatus, or device. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

According to one aspect of the invention, the motor controller 14 is programmed or otherwise configured to estimate an input power of the motor 12. In one embodiment, the motor controller 14 estimates the input power by determining an output power of the motor; determining a speed of the motor; calculating a scaling factor as a function of the speed of the motor; and estimating the input power as a function of the scaling factor and the output power.

Figure 3:
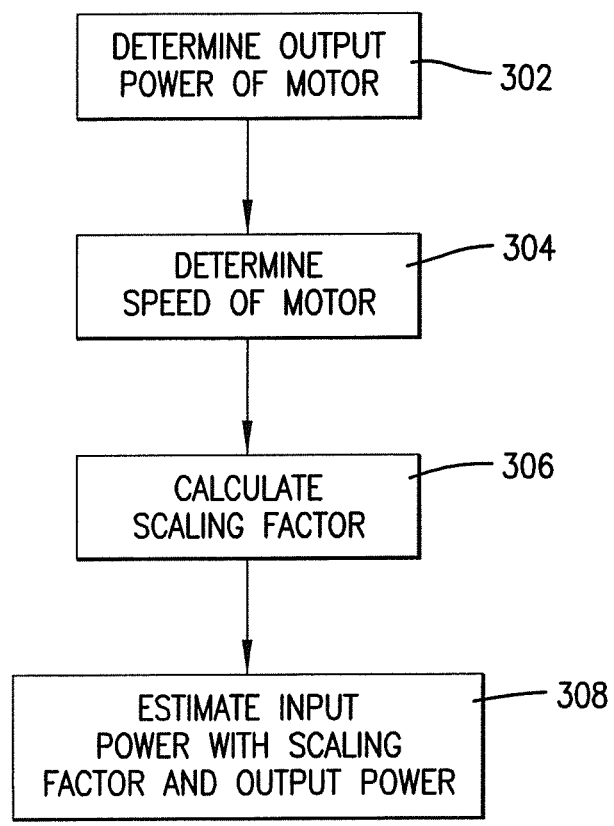
FIG. 3 is a flow diagram depicting steps in a method of the invention and/or code segments of a computer program of the invention.

The flow chart of FIG. 3 shows the functionality and operation of one implementation of the motor controller in more detail. In this regard, some of the blocks of the flow chart may represent a method 300 and/or a module segment or portion of code of the computer programs of the present invention. In some alternative implementations, the functions noted in the various blocks may occur out of the order depicted in FIG. 3. For example, two blocks shown in succession in FIG. 3 may in fact be executed substantially concurrently, or the blocks may sometimes be executed in the reverse order depending upon the functionality involved.

The method 300 begins when the motor controller 14 determines an output power of the motor 12 as depicted in step 302. In some embodiments, the motor controller 14 estimates the output power as a function of the current speed of the motor 12 and a torque of the motor. The speed may be determined as described below and the torque may be determined in any conventional manner. In other embodiments, the motor controller 14 estimates the output power as a function of an output voltage and an output current of the motor. For example, the output voltage and output current may be sensed at the output of the inverter in the motor controller and then transformed with conventional alpha-beta transformation algorithms.

The motor controller 14 also determines the speed of the motor 12 as depicted in step 304. The speed may be sensed with a shaft speed sensor such as a Hall effect sensor or other sensing device or circuit. Sensorless techniques may also be used for determining the motor speed. One type of sensorless speed detection employs algorithms for estimating the rotor speed based on measured electrical parameters. For example, the motor controller 14 may estimate the speed by monitoring the current shunt 24 to determine a stator current frequency, which is proportional to motor speed.

The motor controller 14 then calculates a scaling factor as shown in step 306. The scaling factor is used along with the motor output power to estimate the motor's input power as described below. The scaling factor is preferably calculated as a function of the motor speed to more accurately estimate the motor's input power across all speeds of the motor. A particular scaling factor is described in more detail below.

The motor controller then estimates the motor's input power as a function of the motor's output power and the scaling factor as shown in step 308. In one embodiment, this is done using the equation: input power=$(-K_1X^2+K_2X+K_3)$ times output power, where the quantity in the parentheses is the scaling factor, $K_1$, $K_2$, and $K_3$ are constants, and X is the speed of the motor 12. After testing multiple motors of various different horsepower ratings, applicant discovered that constant values of $K_1=-2.4\times10^{-5}$, $K_2=0.0606$, and $K_3=51.577$ yield the accurate estimates for motor input power for motors of various different sizes, ratings, and/or configurations.

In some embodiments, the motor controller 14 may send data or a signal representative of the estimated motor input power to an external device for control and monitoring purposes. For example, the motor controller may send such information to a computer that monitors the power usage of a number of motors and/or other electrical devices.

Although the invention has been described with reference to the preferred embodiment illustrated in the attached drawing figures, it is noted that equivalents may be employed and substitutions made herein without departing from the scope of the invention as recited in the claims. For example, the claims of the patent application are not necessarily limited to the particular equation and/or constant valves described above. Similarly, other methods that estimate a motor's input power as a function of the motor's output power, speed, and/or torque may be encompassed by the claims of the invention.

Having thus described the preferred embodiment of the invention, what is claimed as new and desired to be protected by Letters Patent includes the following:

1. A computer-implemented method of estimating an input power of an electric motor system including a motor controller and an electric motor to improve controlling operation of the electric motor, the computer-implemented method comprising the following actions performed by the motor controller:
    determining an actual output power of the electric motor in which a torque is changing due to a load on the electric motor; determining a speed of the electric motor;
    calculating a scaling factor which is relevant to the input power of the electric motor system as a function of the speed of the electric motor, wherein the scaling factor is $(-K_1X^2 +K_2X +K_3)$, where X is the speed of the electric motor, $K_1$, $K_2$, and $K_3$ are constants;
    estimating the input power of the electric motor system as the actual output power multiplied by the scaling factor; and
    using the estimated input power to control operation of the electric motor as the torque is changing.

2. The method as set forth in claim 1, wherein the speed of the electric motor is sensed with a shaft speed sensor.

3. The method as set forth in claim 1, wherein the speed of the electric motor is estimated as a function of an electrical characteristic of the electric motor.

4. An electric motor system comprising:
    an electric motor including:
        a stator;
        a rotor rotatably coupled with the stator; a motor shaft rotatable with the rotor; and
        a motor controller for driving the electric motor, the motor controller having a non-transitory memory and a computer program stored in the non-transitory memory for improving controlling operation of the electric motor by performing the following steps:
            determining an actual output power of the electric motor in which a torque is changing due to a load on the electric motor;
            determining a speed of the electric motor;
            calculating a scaling factor which is relevant to the input power of the electric motor system as a function of the speed of the electric motor, wherein the scaling factor is $(-K_1X^2+K_2X +K_3)$, where X is the speed of the electric motor, $K_1$, $K_2$, and $K_3$ are constants;
            estimating the input power of the electric motor system as the actual output power multiplied by the scaling factor; and
            using the estimated input power to control operation of the electric motor as the torque is changing.

5. The electric motor system as set forth in claim 4, wherein the speed of the electric motor is sensed with a shaft speed sensor.

6. The electric motor system as set forth in claim 4, wherein the speed of the electric motor is estimated as a function of an electrical characteristic of the electric motor.

7. An electric motor system comprising:
    an electric motor including:
        an enclosure;
        a stator mounted in the enclosure;
        a rotor rotatably coupled with the stator;
        a motor shaft rotatable with the rotor; and
        a motor controller positioned in the enclosure for driving the electric motor, the motor controller having a non-transitory memory and a computer program stored in the non-transitory memory for improving controlling operation of the electric motor by performing the following steps:
            estimating an actual output power of the electric motor as a function of the speed of the motor and a torque of the motor in which the torque is changing due to a load on the electric motor;
            determining a speed of the electric motor;
            calculating a scaling factor which is relevant to the input power of the electric motor system as a function of the speed of the electric motor;
            estimating the input power of the electric motor system as the actual output power multiplied by the scaling factor, wherein the scaling factor is $((-2.4\times10^{-5})X^2+0.0606X+51.577)$, where X is the speed of the electric motor; and
            using the estimated input power to control operation of the electric motor as the torque is changing.

8. The electric motor system as set forth in claim 7, wherein the speed of the electric motor is sensed with a shaft speed sensor.

9. The electric motor system as set forth in claim 7, wherein the speed of the electric motor is estimated as a function of an electrical characteristic of the electric motor.

* * * * *